(12) United States Patent
Nakamura et al.

(10) Patent No.: US 9,238,593 B2
(45) Date of Patent: *Jan. 19, 2016

(54) CERAMIC MEMBER, PROBE HOLDER, AND MANUFACTURING METHOD OF CERAMIC MEMBER

(75) Inventors: Akira Nakamura, Kanagawa (JP); Kohei Suzuki, Kanagawa (JP); Shinya Miyaji, Kanagawa (JP); Shinji Saito, Kanagawa (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 154 days.

This patent is subject to a terminal disclaimer.

(21) Appl. No.: 13/809,290

(22) PCT Filed: Jul. 13, 2011

(86) PCT No.: PCT/JP2011/066009
§ 371 (c)(1),
(2), (4) Date: Jan. 9, 2013

(87) PCT Pub. No.: WO2012/008502
PCT Pub. Date: Jan. 19, 2012

(65) Prior Publication Data
US 2013/0115416 A1    May 9, 2013

(30) Foreign Application Priority Data

Jul. 14, 2010 (JP) ................................. 2010-160059

(51) Int. Cl.
 *B32B 3/24*  (2006.01)
 *C04B 35/583*  (2006.01)
(Continued)

(52) U.S. Cl.
CPC ............... *C04B 35/583* (2013.01); *C04B 35/20* (2013.01); *C04B 35/645* (2013.01);
(Continued)

(58) Field of Classification Search
CPC ............ C04B 35/583; C04B 2235/386; Y10T 428/24273
USPC .......................................................... 428/131
See application file for complete search history.

(56) References Cited

U.S. PATENT DOCUMENTS 4,434,117 A    2/1984   Inoguchi et al.
5,854,155 A   12/1998   Kawasaki et al.
(Continued)

FOREIGN PATENT DOCUMENTS

CN    1173479 A     2/1998
JP   56-145170 A   11/1981
(Continued)

OTHER PUBLICATIONS

Office Action dated Oct. 15, 2013, issued for the Chinese patent application No. 201180033843.6.
(Continued)

Primary Examiner — William P Watkins, III
(74) Attorney, Agent, or Firm — Locke Lord LLP (57) ABSTRACT

There is provided a ceramic member which is a sintered body containing enstatite and boron nitride as constituents, in which boron nitride is oriented in a single direction, a probe holder formed using the ceramic member, and a manufacturing method of the ceramic member. In the ceramic member, an index of orientation degree is not less than 0.8. In so doing, it is possible to provide a ceramic member which has a free machining property, a coefficient of thermal expansion which is close to that of silicon, and high strength, and a probe holder which is formed using the ceramic member, and a manufacturing method of the ceramic member.

13 Claims, 7 Drawing Sheets

(51) Int. Cl.
*C04B 35/20* (2006.01)
*C04B 35/645* (2006.01)
*G01R 1/067* (2006.01)
*G01R 3/00* (2006.01)

(52) U.S. Cl.
CPC .... *C04B 35/6455* (2013.01); *C04B 2235/3206* (2013.01); *C04B 2235/3217* (2013.01); *C04B 2235/3225* (2013.01); *C04B 2235/3418* (2013.01); *C04B 2235/3445* (2013.01); *C04B 2235/386* (2013.01); *C04B 2235/5292* (2013.01); *C04B 2235/656* (2013.01); *C04B 2235/767* (2013.01); *C04B 2235/77* (2013.01); *C04B 2235/787* (2013.01); *C04B 2235/80* (2013.01); *C04B 2235/96* (2013.01); *C04B 2235/9607* (2013.01); *G01R 1/06722* (2013.01); *G01R 3/00* (2013.01); *Y10T 428/24273* (2015.01)

(56) References Cited

U.S. PATENT DOCUMENTS

| | | | |
|---|---|---|---|
| 6,096,671 | A | 8/2000 | Kawasaki et al. |
| 2006/0027934 | A1* | 2/2006 | Edelstein et al. ............. 257/774 |
| 2010/0000347 | A1 | 1/2010 | Miyaji et al. |
| 2010/0327897 | A1 | 12/2010 | Kazama et al. |
| 2012/0067145 | A1 | 3/2012 | Suzuki et al. |

FOREIGN PATENT DOCUMENTS

| | | | |
|---|---|---|---|
| JP | H04157139 | A | 5/1992 |
| JP | 07-206522 | A | 8/1995 |
| JP | 09-202663 | A | 8/1997 |
| JP | 2002-356374 | A | 12/2002 |
| JP | 2005-029421 | A | 2/2005 |
| JP | 3890915 | B2 | 12/2006 |
| JP | 2010275149 | A | 12/2010 |
| WO | WO-2008/013145 | A1 | 1/2008 |
| WO | WO-2009/107747 | A1 | 9/2009 |
| WO | WO-2010/137440 | A1 | 12/2010 |

OTHER PUBLICATIONS

Office Action dated Apr. 11, 2014, issued for the Korean patent application No. 2013-7000996.

International Search Report dated Sep. 27, 2011, issued for PCT/JP2011/066009.

Decision to Grant a Patent mailed on Apr. 21, 2015 issued for corresponding Japanese Patent Application No. 2010-160059.

* cited by examiner

CERAMIC MEMBER, PROBE HOLDER, AND MANUFACTURING METHOD OF CERAMIC MEMBER

FIELD

The present invention relates to a ceramic member which is obtained by sintering a material with a predetermined composition, a probe holder which is formed using the ceramic member and holds a probe to be applied to an electrical property test for a semiconductor integrated circuit or the like, and a manufacturing method of the ceramic member.

BACKGROUND

Conventionally, a probe holder with a thin plate shape on which multiple minute through holes are formed is embedded in a micro contactor to be used for a semiconductor test or a liquid crystal test in order to insert probes for electrically connecting a circuit structure of a test object with a circuit structure for sending a signal for the test. As the probe holder, a ceramic member with a free machining property (machinable ceramics) with which machining becomes possible is used (see Patent Literature 1, for example).

CITATION LIST

Patent Literature

Patent Literature 1: Japanese Patent No. 3890915

SUMMARY

Technical Problem

Incidentally, the micro contactor is used under an environment of a temperature which changes from a normal temperature to a high temperature as in a burn-in test of a silicon wafer, for example. Accordingly, in addition to the free machining property, it has been desired to make a coefficient of thermal expansion of the probe holder to approach that of silicon in order to avoid contact failure of the probe in the test due to a difference in the coefficients of thermal expansion of silicon.

In addition, an increase in the number of probes in the micro contactor has been required in recent years as a probe pitch is further narrowed. However, since total burden on a spring in the probe holder increases as the number of probes increases, warpage of the holder itself increases when the holder size is the same. Since the contact state of the probe of the micro contactor becomes unstable at a center and an end of the wafer when warpage increases as described above, the ceramic member has been required to have higher strength.

The present invention was made in view of the above circumstances, an object is to provide a ceramic member which has a free machining property, a coefficient of thermal expansion which is close to that of silicon, and high strength, and a probe holder which is formed using the ceramic member, and a manufacturing method of the ceramic member.

Solution to Problem

To solve the problem described above and achieve the object, a ceramic member according to the present invention includes enstatite and boron nitride as constituents, wherein the ceramic member is a sintered body in which the boron nitride is oriented in a single direction.

Moreover, in the invention described above, the ceramic member according to the present invention is characterized in that an index of an orientation degree $K=|\log_{10}\{(I_{(100)}/I_{(002)})\|/I_{(100)}/I_{(002)})\perp\}|$, which is given based on a ratio $(I_{(100)}/I_{(002)})\|$ between strength $I_{(002)}$ of x-ray diffraction along a (002) plane of a crystal of the boron nitride and strength $I_{(100)}$ of x-ray diffraction along a (100) plane when x-ray irradiation is performed in a direction which is perpendicular to an orientation direction of the boron nitride and a ratio $(I_{(100)})/I_{(002)})$ between strength $I_{(002)}$ of x-ray diffraction along the (002) plane and strength $I_{(100)}$ of x-ray diffraction along the (100) plane when x-ray irradiation is performed in the orientation direction, is not less than 0.8.

Moreover, in the invention described above, the ceramic member according to the present invention is characterized in that a coefficient of thermal expansion which is measured based on JIS R 1618 at 20° C. to 250° C. in a direction in parallel to a direction in which the boron nitride is oriented is $(3 \text{ to } 5)\times 10^{-6}/°$ C.

Moreover, in the invention described above, the ceramic member according to the present invention is characterized in that three-point bending strength measured based on JIS R 1601 is not less than 200 MPa.

Moreover, in the invention described above, the ceramic member according to the present invention is characterized in that relative density is not less than 99%.

Moreover, in the invention described above, the ceramic member according to the present invention is characterized in that boron nitrogen has a hexagonal crystal structure and is in a form of scale-shaped grains.

Moreover, to solve the problem described above and achieve the object, a probe holder according to the present invention includes through holes capable of allowing probes formed of a conductive material to be inserted and accommodates the probes, the probe holder including a base material formed using the ceramic member, wherein the through holes are formed in the base material in a direction which is perpendicular to the orientation direction of the boron nitride.

Moreover, to solve the problem described above and achieve the object, a manufacturing method of a ceramic member according to the present invention includes: a mixing step of mixing boron nitride, silicon oxide, magnesium oxide, and sintering agent; an external force acting step of making external force directed in a single direction act on a mixture mixed in the mixing process; and a sintering step of sintering the mixture.

Moreover, in the invention described above, the manufacturing method of a ceramic member according to the present invention is characterized in that the sintering agent contains yttrium oxide and aluminum oxide.

Moreover, in the invention described above, the manufacturing method of a ceramic member according to the present invention is characterized in that the external force acting step and the sintering step are collectively performed by a hot pressing sintering method.

Moreover, in the invention described above, the manufacturing method of a ceramic member according to the present invention is characterized in that a sintering temperature in the sintering step is from 1200° C. to 1300° C.

Moreover, in the invention described above, the manufacturing method of a ceramic member according to the present invention is characterized in that the sintering step is performed in a depressurized atmosphere or an inert atmosphere.

Moreover, in the invention described above, the manufacturing method of a ceramic member according to the present invention is characterized in that the boron nitride has a hexagonal crystal structure and is in a form of scale-shaped grains.

Advantageous Effects of Invention

According to the present invention, it is possible to provide a ceramic member which has a free machining property, a coefficient of thermal expansion which is close to that of silicon, and high strength by causing the ceramic member to contain at least enstatite and boron nitride as constituents and orienting boron nitride in a single direction, a probe holder which is formed using the ceramic member, and a manufacturing method of the ceramic member.

In addition, according to the manufacturing method of the ceramic member of the present invention, it is possible to manufacture a ceramic member which has a free machining property, substantially the same coefficient of thermal expansion in a plate surface direction as that of a material of a silicon wafer as a test object, and high strength by providing: a mixing process in which boron nitride, silicon oxide, magnesium oxide, and sintering agent are mixed; an external force acting process in which external force directed in a single direction is made to act on a mixture mixed in the mixing process; and a sintering process in which the mixture is sintered.

DESCRIPTION OF EMBODIMENTS

Figure 1:
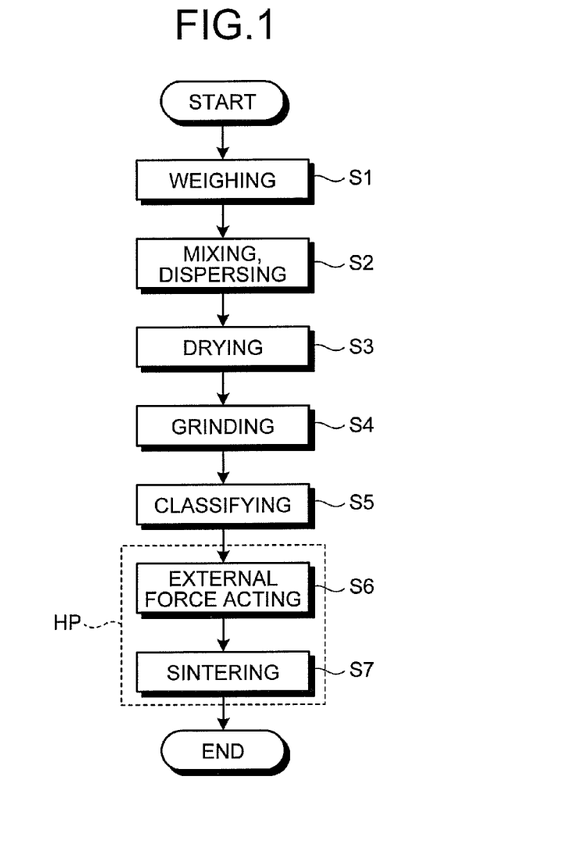
FIG. 1 is a flow chart illustrating an outline of a manufacturing method of a ceramic member according to an embodiment of the present invention.

Hereinafter, a detailed description will be given of embodiments relating to a ceramic member, a probe holder, and a manufacturing method of the ceramic member according to the present invention based on the drawings. In addition, the embodiments are not intended to limit the present invention. FIG. 1 is a flow chart illustrating an outline of a manufacturing method of a ceramic member according to an embodiment of the present invention. First, boron nitride (BN), silicon oxide ($SiO_2$), and magnesium oxide (MgO) are prepared as raw materials, and a raw material containing yttrium oxide ($Y_2O_3$) and aluminum oxide ($Al_2O_3$) is weighed as a sintering agent (Step S1).

Here, magnesium oxide is added in order to obtain enstatite ($MgSiO_3$) and boron nitride (BN) as main component phases of the sintered ceramic member by promoting reactive sintering and generating enstatite ($MgSiO_3$) and adjusting a coefficient of thermal expansion. In addition, it is possible to use a composite oxide including a lanthanoid metal oxide or spinel which has been conventionally used, mixture thereof, and further using a substance obtained by adding magnesium oxide to the mixture as the sintering agent.

Subsequently, mixing and dispersing of the substances weighed in Step 1 are performed (Step S2). Specifically, the substance obtained by adding water, alcohol, or another solvent to the raw materials weighed in Step S1 is mixed and dispersed by a wet ball mill. Subsequently, the mixture obtained in Step S2 is dried in an evaporator, and the solvent is removed (Step S3). Accordingly, the mixture of boron nitride, silicon oxide, magnesium oxide, and the sintering agent becomes a flake-like aggregate. The content of boron nitride in the mixture is 49.3 wt %, the content of silicon oxide is 24.8 wt %, the content of magnesium oxide is 19.6 wt %, the content of yttrium oxide is 4.7 wt %, and the content of aluminum oxide is 1.6 wt %.

Next, the aggregate of the mixture obtained in Step S3 is ground (Step S4). In Step S4, a mortar and/or dry ball mill is used depending on grain size distribution to be achieved after the grinding. Thereafter, the mixture is classified by using mesh passing (Step S5), an average grain size of the aggregate is reduced, and the grain sizes are uniformized.

Thereafter, an external force is made to act on the mixture, of which the average grain size has been reduced and the grain sizes have been uniformized, in a predetermined single direction (Step S6), and sintering is performed (Step S7). In this embodiment, a hot pressing sintering method can be applied as a method of sintering the mixture. The hot pressing sintering method is a method in which a mixture is placed in a mold frame made of carbon in a hot pressing apparatus and sintering is performed thereon while pressurization with a press is performed in a predetermined single direction. Accordingly, when the mixture is sintered by the hot pressing sintering method, the external force acting process in Step S6 and the sintering process in Step S7 are collectively performed (Step HP illustrated in a broken line region in FIG. 1).

In the manufacturing method of a ceramic member according to the present invention, a hot pressing sintering temperature in Step HP is from 1200° C. to 1300° C., and a sintering time is two hours. Since the ceramic member is sintered at a temperature which is lower than an ordinary sintering temperature of ceramics, for example, the ceramic member in Patent Literature 1 (1750° C.), bonding between the mold frame and the ceramic member due to a reaction with the mold frame, made of carbon, in the sintering process is suppressed.

Since boron nitride used in this embodiment has a hexagonal crystal structure and is in the form of scale-shaped grains, the surfaces of the scale shapes are aligned in a direction which is substantially perpendicular to an external force acting direction by making the external force directed in one direction act thereon. As a result, the mixture is oriented in parallel to a direction which is perpendicular to the external force acting direction, namely along a plate surface of the sintered body.

The ceramic member according to this embodiment is completed by Step S1 to Step S7 described above. The ceramic member manufactured as described above contains at least enstatite (MgSiO$_3$) and boron nitride (BN) as constituents and exhibits a satisfactory electrical insulating property, and the surface directions of the scale-shaped boron nitride grains are substantially aligned such that the boron nitride grains are oriented in one direction.

On this occasion, the content of enstatite in the manufactured ceramic member is 41.4 (wt %) based on a theoretical calculation value. Here, the theoretical calculation value was calculated on the assumption that all silicon oxide used as a raw material was used for generating enstatite.

Figure 2:
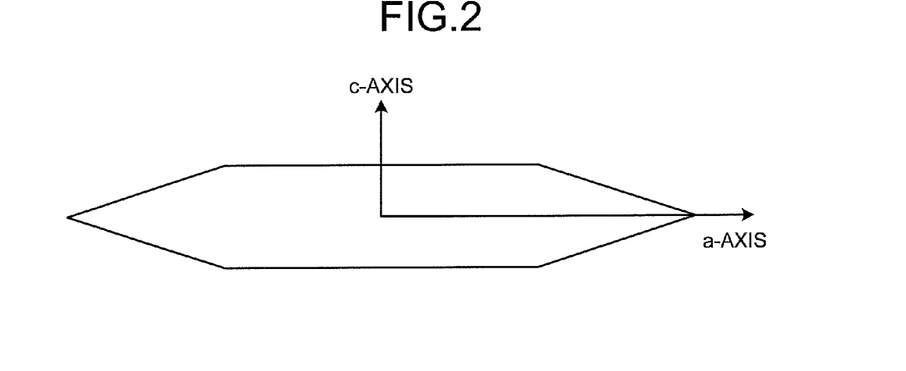
FIG. 2 is a view illustrating an a-axis and a c-axis of hexagonal boron nitride contained in the ceramic member.

FIG. 2 illustrates an a-axis and a c-axis of the scale-shaped boron nitride grain. The sintered body obtained by the sintering preferably has an index of an orientation degree of not less than 0.8. An index of an orientation degree K is a value of not less than 0, and when I.O.P (The Index of Orientation Preference)<1, the c-axis of the boron nitride crystals corresponding to a (002) plane is oriented parallel to a pressurization direction in the test material, which means that the surfaces of the scale-shaped boron nitride crystals are aligned in the plate surface direction of the sintered ceramic member. On the other hand, when I.O.P>1, the a-axis of the boron nitride crystals corresponding to a (100) plane is oriented parallel to the pressurization direction in the test material, which means that the surfaces of the scale-shaped boron nitride grains are aligned in a direction in parallel to the pressurization direction. In addition, a case where I.O.P=1 (K=0) means that the directions of the boron nitride grains are random in the test material.

The index of the orientation degree is an absolute value of a common logarithm of the index of orientation preference, and the index of the orientation degree K is given by the following equation.

$$K=|\log_{10}\{(I_{(100)}/I_{(002)})\|/(I_{(100)}/I_{(002)})\perp\}|$$

In this context, $I_{(100)}$ represents strength of x-ray diffraction of the boron nitride crystals along the (100) plane when the test material is irradiated with an x-ray, and similarly, $I_{(002)}$ represents strength of x-ray diffraction of the boron nitride crystals along the (002) surface. $(I_{(100)}/I_{(002)})\|$ represents a ratio between the strength $I_{(100)}$ of the x-ray diffraction of the boron nitride crystals along the (100) surface and the strength $I_{(002)}$ of the x-ray diffraction along the (002) plane when the test material is irradiated with an x-ray from a direction which is parallel to the pressurization direction during the pressurization sintering. $(I_{(100)}/I_{(002)})\perp$ represents a ratio between the strength $I_{(100)}$ of the x-ray diffraction along the (100) plane and the strength $I_{(002)}$ of the x-ray diffraction along the (002) plane when the x-ray irradiation is performed in a direction which is perpendicular to the pressurization direction. In addition, the index of orientation preference (I.O.P) is given by the following equation.

$$\text{I.O.P}=(I_{(100)}/I_{(002)})\|/(I_{(100)}/I_{(002)})\perp$$

As for the index of orientation preference, detailed description was given in Milan Hubacek, et al., J. Am. Ceram. Soc. 82 [1] 156-160 (1999), "Effect of the Orientation of Boron Nitride Grains on the Physical Properties of Hot-Pressed Ceramics."

In addition, the coefficient of thermal expansion of the manufactured ceramic member, which is measured based on JIS R1618 (a thermal expansion measurement method based on a thermo-mechanical analysis for fine ceramics) at 20° to 250° C. in a direction in which boron nitride is oriented, is preferably within a range of (3 to 5)×10$^{-6}$/° C. In so doing, the coefficient of thermal expansion of the ceramic member in the orientation direction of the boron nitride grains becomes a value that is close to 3.4×10$^{-6}$/° C. which is a coefficient of thermal expansion of silicon.

The three-point bending strength of the manufactured ceramic member, which is measured based on JIS R 1601 (a room temperature bending strength test method for fine ceramics), is preferably not less than 200 MPa. In so doing, the strength against warpage increases even when the ceramic member is formed into a thin plate shape.

In addition, relative density of the manufactured ceramic member is preferably not less than 99%. In so doing, the constituents of the ceramic member become precise due to the sintering, and the strength against warpage increases.

Figure 3:
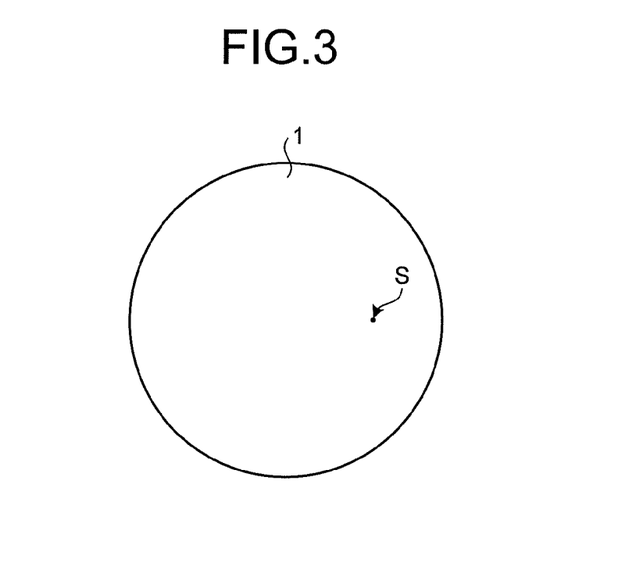
FIG. 3 is a view illustrating a configuration of a probe holder which is formed using the ceramic member according to the embodiment of the present invention.
Figure 4:
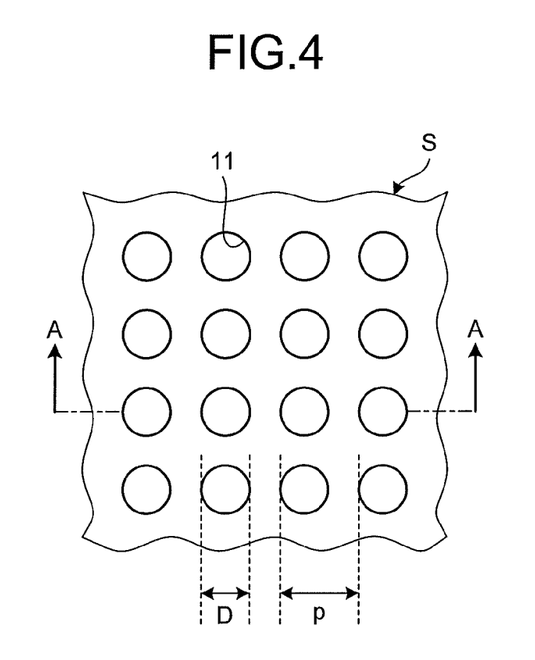
FIG. 4 is a partially enlarged view in which a minute region of the probe holder illustrated in FIG. 3 is enlarged.
Figure 5:
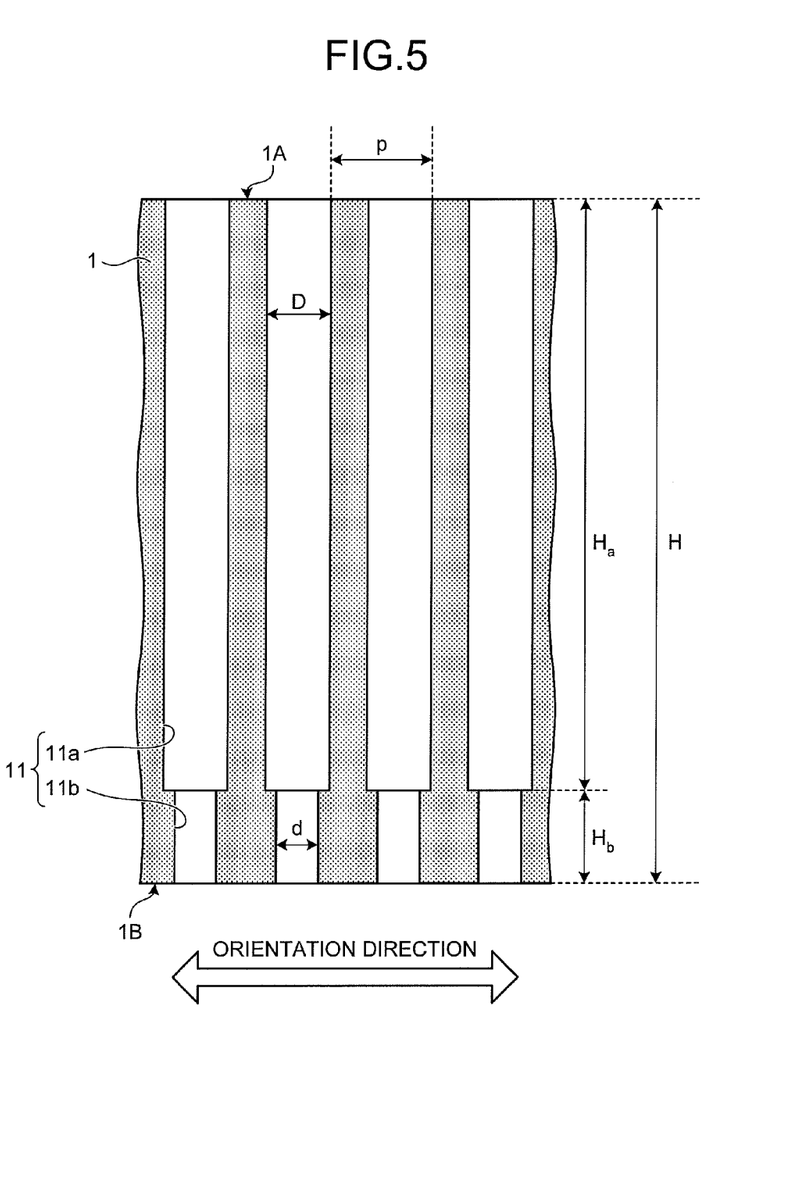
FIG. 5 is a cross-sectional view taken along a line A-A in FIG. 4.

Since the ceramic member according to this embodiment electrically connects a silicon wafer or another circuit substrate used as a test object and a wiring substrate for sending a signal for the test, the ceramic member can be applied as an insulating base material of the probe holder for holding a probe formed of a conductive material. FIG. 3 is a view illustrating a configuration of the probe holder according to the embodiment. In addition, FIG. 4 is a partially enlarged view in which a minute region S of a probe holder 1 illustrated in FIG. 3 is enlarged, and FIG. 5 is a cross-sectional view taken along a line A-A in FIG. 4. In addition, the drawings are schematically illustrated, it should be noted that a relationship between a thickness and a width of each part, a ratio of thicknesses of the parts, and the like may be different from those in practice in some cases, and it is a matter of course that parts with different dimensional relationships and ratios may be included between the drawings in some cases.

The probe holder 1 illustrated in FIGS. 3 to 5 has a thin disk shape and corresponds to a part of a probe card which is a micro contactor to be applied to a full wafer level test, a wafer level burn-in test, and the like of a silicon wafer (a configuration of the probe card will be described later). In the probe holder 1, several thousands to several tens of thousands of through holes 11 which penetrate through the ceramic member sintered as described above in the plate thickness direction (the vertical direction in FIG. 5) are formed. Each of the through holes 11 has a large diameter portion 11a with a diameter D which is bored in the plate thickness direction from a surface 1A which faces the wiring side for sending the signal for the test and a small diameter portion 11b with a diameter d (<D) which has the same center axis as that of the large diameter portion 11a and a smaller diameter than that of the large diameter portion 11a and is bored in the plate thickness direction from a surface 1B which faces the silicon wafer as a test object in the test, and a probe arranged in accordance with alignment of the silicon wafer as the test object is accommodated therein.

Here, the boron nitride grains are oriented parallel to the plate surface of the probe holder 1 which is perpendicular to the penetrating direction of the through holes 11. For this reason, the coefficient of thermal expansion of the probe holder 1 in the orientation direction illustrated in FIG. 5 is substantially the same as the coefficient of thermal expansion of the silicon wafer regardless of the temperature. As a result, the probe holder 1 can exactly bring the probe into contact with the silicon wafer regardless of the temperature. In addition, although the orientation directions of the boron nitride grains in the probe holder 1 are applicable as long as the orientation directions are aligned along the plate surface, it is more preferable that the orientation directions are parallel to the plate surface as described above.

When each of the through holes 11 is formed in the probe holder 1, a thickness of H is achieved by enhancing a degree of flatness and a degree of parallelism of the ceramic member by using a surface grinder, the small diameter portion 11b is then formed up to a predetermined depth $H_b$ from the surface 1B, and the large diameter portion 11a is then formed by performing drill machining up to a predetermined depth $H_a$ from the surface 1A ($H=H_a+H_b$). In addition, although drill machining using carbide drills adapted to the respective diameters is performed when the large diameter portion 11a and the small diameter portion 11b are formed, a working technique using laser, etching, punching, an electron beam, an ion beam, or the like may be applied. It is possible to realize working on the ceramic member according to this embodiment such that an aspect ratio of each through hole 11 (for example, a ratio $H_b/d$ of a hole depth $H_b$ with respect to the diameter d in the small diameter portion 11b) is not less than 15.

Figure 6:
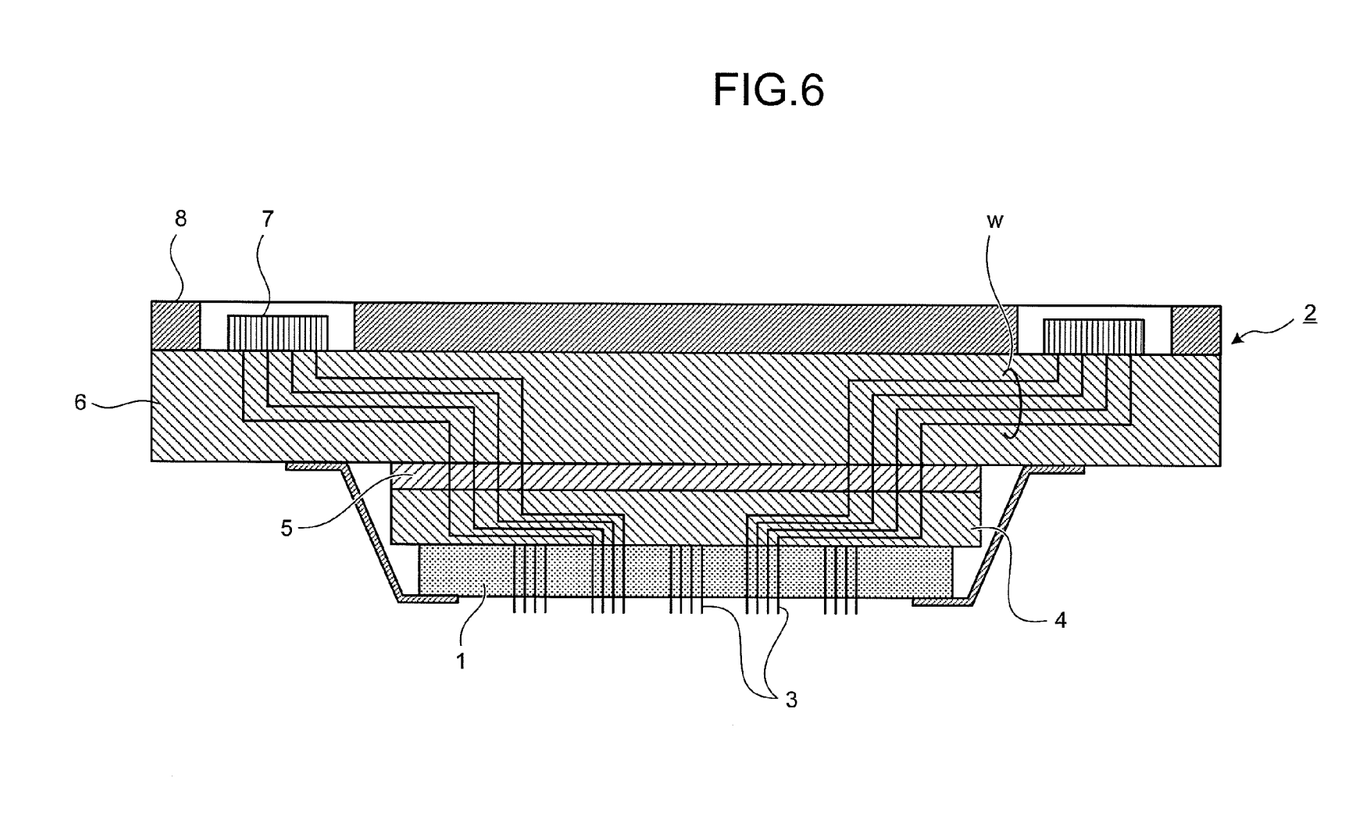
FIG. 6 is a view schematically illustrating a configuration of main parts of a probe card configured by using the probe holder according to the embodiment of the present invention.

FIG. 6 is a view schematically illustrating a configuration of main parts of a probe card configured by using the probe holder 1. A probe card 2 illustrated in the drawing is provided with the aforementioned probe holder 1, probes 3 which are accommodated in and held by the through holes 11 of the probe holder 1, a space transformer 4 which transforms intervals of minute wiring w in the probe holder 1, an interposer 5 which relays the wiring w sticking out of the space transformer 4, a wiring substrate 6 which connects the wiring w relayed by the interposer 5 to a test apparatus, a male connector 7 which is provided in the wiring substrate 6 so as to be connected to a female connector provided on the side of the test apparatus, and a reinforcing member 8 which reinforces the wiring substrate 6.

Figure 7:
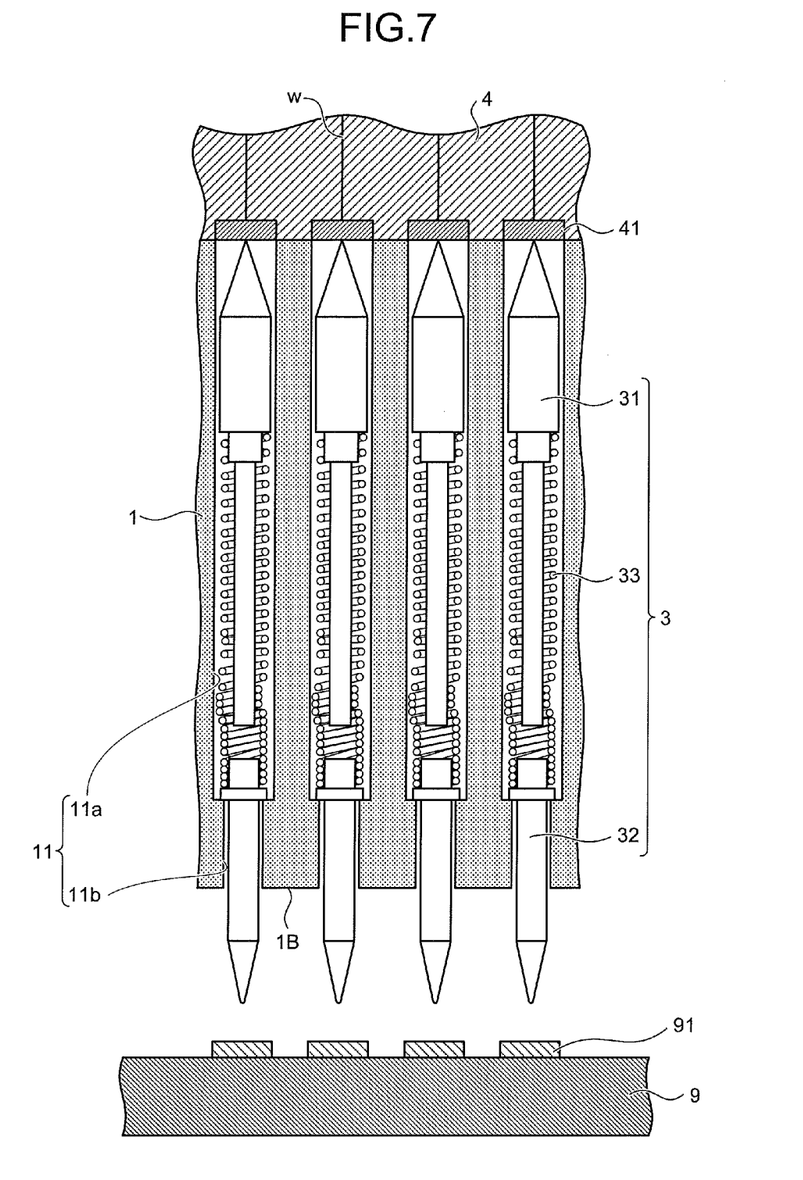
FIG. 7 is a view illustrating a detailed configuration of the probe and a probe holding state of the probe holder.

FIG. 7 is a view illustrating a detailed configuration of the probe 3 and a probe 3 holding state of the probe holder 1. In each probe 3, a needle-shaped member 31 with a tip end which is brought into contact with an electrode pad 41 provided in the space transformer 4, a needle-shaped member 32 which projects from the surface 1B in an opposite direction to the needle-shaped member 31 and is brought into contact with an electrode pad 91 of a silicon wafer 9, and a spring member 33 which is provided between the needle-shaped member 31 and the needle-shaped member 32 to couple the two needle-shaped members 31 and 32 in a stretchable manner are coaxially coupled. A flange is formed in the vicinity of the base end portion of the needle-shaped member 32 so as to prevent dropping by a stepped portion at a border between the small diameter portion 11b and the large diameter portion 11a of the through hole 11. A specific alignment pattern of the probe 3 in the probe holder 1 is determined depending on an arrangement pattern of the electrode pads 91 on the silicon wafer 9 which is the test object.

The probe holder 1 can be applied to an electrical property test under various temperature conditions. For example, it is possible to apply the probe holder 1 not only to an electrical property test under a condition that a temperature of the test object is equal to a temperature of the ceramic member which is a base material of the probe holder 1 but also to an electrical property test under a condition that the temperature of the test object is higher than the temperature of the ceramic member.

According to the manufacturing method of the ceramic member of the aforementioned embodiment of the present invention, it is possible to provide a ceramic member which has a free machining property, a coefficient of thermal expansion which is close to that of silicon, and high strength and a probe holder which is formed using the ceramic member.

In addition, in the probe holder 1 according to this embodiment, the orientation direction of the boron nitride grains is oriented in parallel to the plate surface, and the probe holder 1 has the coefficient of thermal expansion which is close to that of silicon which is a material of the silicon wafer 9 as the test object. For this reason, the probe holder 1 causes a variation by thermal expansion at a position at which the probe 3 is brought into contact to occur after a variation due to thermal expansion of the silicon wafer 9.

As a result, even when a plurality of tests are performed under different temperature environments, the probe holder 1 according to this embodiment can exactly bring the probes 3 into contact with the electrode pads 91 on the silicon wafer 9 regardless of temperature. For this reason, the probe card 2 using the probe holder 1 according to this embodiment does not require replacement of the probe holder 1 in accordance with a temperature range, and therefore, it is possible to shorten the test time and reduce the cost required for the tests.

In addition, the external force acting process and the sintering process in the manufacturing method of the ceramic member according to this embodiment are not limited to the hot pressing sintering method. For example, a slip casting method may be applied as the external force acting process. When the slip casting method is applied, the boron nitride grains settle and are deposited in the mold due to force of gravity as external force. In so doing, the boron nitride grains are oriented. When the aggregate containing the thus oriented boron nitride grains is sintered, a depressurized sintering method, an inert atmosphere sintering method, or another conventionally known sintering method may be applied. In addition, sintering may be performed using the hot pressing sintering method after the slip casting method is applied. When the hot pressing sintering method is used, the orientation direction of the boron nitride grains generated by the slip cast method may be perpendicular to the pressurization direction in the hot pressing sintering method.

Incidentally, the probe holder which can be manufactured from the ceramic member according to this embodiment is not limited to a full wafer type according to which the probes are collectively brought into contact with the electrode pads on the silicon wafer and can be applied as a socket type probe holder and the like. Although the description was given of a case of using the probe holder for accommodating pin-type probes, in each of which pins are coupled with the spring member, in this embodiment, it is also possible to apply the aforementioned ceramic member as a probe holder for accommodating another type of probe (a wire type, a blade type, or the like).

In addition, the ceramic member according to this embodiment may be used not only as the base material of the probe holder 1 but also as the base material of the space transformer 4 used in the probe card 2. In so doing, the probe card 2 can more exactly connect the minute wiring w between the probe holder 1 and the space transformer 4 regardless of a temperature even when tests are performed under different temperature environments. For this reason, reliability of the probe card 2 is enhanced.

EXAMPLES

Example 1

Next, a description will be given of examples of the present invention. In Example 1, a sintered body with a size of 90 mm long×90 mm wide×20 mm thick was sintered using a raw material lot L1, using 49.3 (wt %) of boron nitride (BN), 24.8 (wt %) of silicon oxide ($SiO_2$), and 19.6 (wt %) of magnesium oxide (MgO) as raw materials, and using 4.7 (wt %) of yttrium oxide ($Y_2O_3$) and 1.6 (wt %) of aluminum oxide ($Al_2O_3$) as sintering agent by the manufacturing method described in the above embodiment. For sintering, the external force acting process and the sintering process were collectively performed by the hot pressing sintering method. In performing the hot pressing sintering, pressurization with a press was performed in a single direction under a sintering contact pressure of 25 MPa in a nitrogen atmosphere of 600 mmHg, and the sintering was performed at a sintering temperature of 1250° C. for two hours. After the sintering, presence of constituents contained in the sintered ceramic member was analyzed based on x-ray diffraction.

Figure 8:
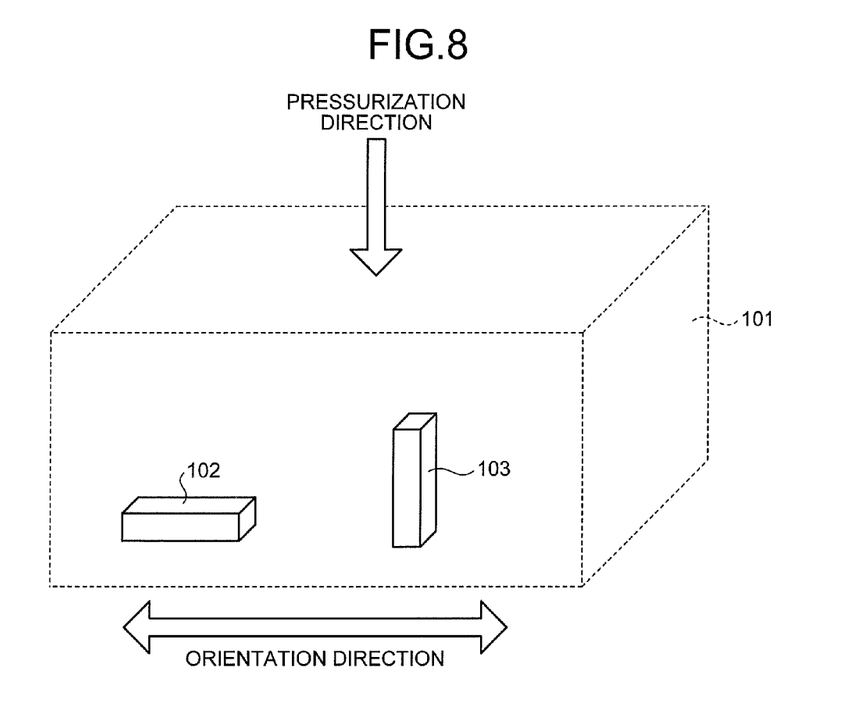
FIG. 8 is a view illustrating a test piece used in thermal expansion measurement performed in Example 1 of the present invention.
Figure 9:
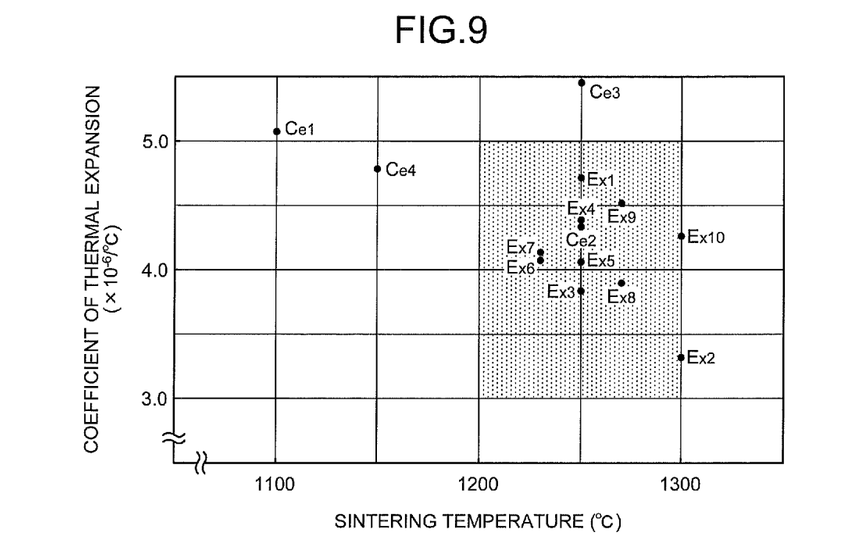
FIG. 9 is a view illustrating a relationship between a coefficient of thermal expansion measured by using the test piece and a sintering temperature.
Figure 10:
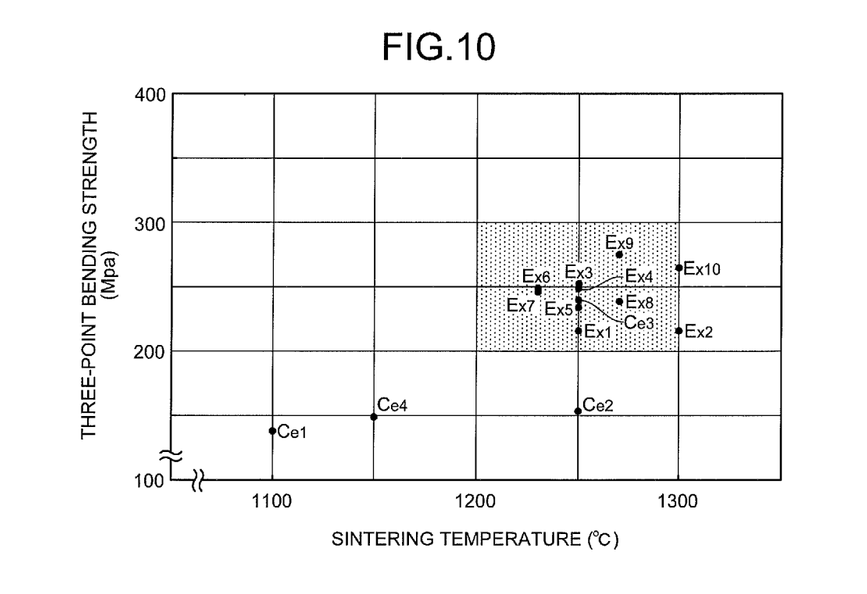
FIG. 10 is a view illustrating a relationship between three-point bending strength measured by using the test piece and the sintering temperature.

FIG. 8 is a view schematically illustrating a test piece used in measurement in Example 1, and specifically, FIG. 8 schematically illustrates how to cut the test piece from a sintered body 101 (illustrated by a broken line). FIG. 9 is a view illustrating a relationship between a coefficient of thermal expansion measured by using the test piece and a sintering temperature. FIG. 10 is a view illustrating a relationship between the three-point strength measured by using the test piece and the sintering temperature. Table 1 is a table illustrating a raw material lot number of a raw material used in manufacturing the ceramic member, content of the raw material and the sintering agent (wt %), a sintering temperature (° C.), a sintering pressure (MPa), presence of constituents contained in the sintered ceramic member, a coefficient of thermal expansion, three-point bending strength, an index of orientation preference, an index of an orientation degree, and relative density. Table 2 is a table illustrating a relationship of a coefficient of thermal expansion in the orientation direction, which was measured in a predetermined temperature range from 20° C. to 250° C. by using the test piece and a coefficient of thermal expansion in the pressurization direction with a temperature. In Table 1, the raw material lot number is a number indicating a difference in the raw material lots used in sintering the ceramic member.

Among the two test pieces 102 and 103 illustrated in FIG. 8, the test piece 102 was manufactured for measuring thermal expansion in the orientation direction of the boron nitride grains, and the test piece 103 was manufactured for measuring thermal expansion in the pressurization direction (a direction which is perpendicular to the orientation direction). The thus cut test piece 102 was used to measure a coefficient of thermal expansion ($\times 10^{-6}/°$ C.) based on JIS R 1618, and three-point bending strength based on JIS R 1601 was measured. The result is illustrated in Table 1 along with a raw material lot number of a raw material used in Example 1, content of the raw material and the sintering agent (wt %), a sintering temperature (° C.), a sintering pressure (MPa), presence of constituents contained in the sintered ceramic member, an index of orientation preference, an index of an orientation degree, and relative density. In Table 1, the raw material lot number is a number indicating a difference in the raw material lots used in sintering the ceramic member. In addition, the measurement result in Example 1 is as points Ex1 respectively in FIGS. 9 and 10.

TABLE 1

| | Raw Material Lot | Raw Material (wt %) | | | Sintering Agent (wt %) | | | Sintering Temperature (° C.) | Sintering Pressure (MPa) | Constituent | | |
|---|---|---|---|---|---|---|---|---|---|---|---|---|
| | | BN | $SiO_2$ | MgO | $Y_2O_3$ | $Al_2O_3$ | Total | | | $MgSiO_3$ | BN | $2MgO \cdot SiO_2$ |
| Example 1 | L1 | 49.3 | 24.8 | 19.6 | 4.7 | 1.6 | 100 | 1,250 | 25 | ○ | ○ | ○ |
| Example 2 | L2 | 49.3 | 24.8 | 19.6 | 4.7 | 1.6 | 100 | 1,300 | 25 | ○ | ○ | ○ |
| Example 3 | L3 | 49.3 | 24.8 | 19.6 | 4.7 | 1.6 | 100 | 1,250 | 25 | ○ | ○ | — |
| Example 4 | L3 | 49.3 | 24.8 | 19.6 | 4.7 | 1.6 | 100 | 1,250 | 25 | ○ | ○ | ○ |
| Example 5 | L4 | 49.3 | 24.8 | 19.6 | 4.7 | 1.6 | 100 | 1,250 | 25 | ○ | ○ | — |
| Example 6 | L3 | 49.3 | 24.8 | 19.6 | 4.7 | 1.6 | 100 | 1,230 | 25 | ○ | ○ | — |
| Example 7 | L4 | 49.3 | 24.8 | 19.6 | 4.7 | 1.6 | 100 | 1,230 | 25 | ○ | ○ | — |
| Example 8 | L4 | 49.3 | 24.8 | 19.6 | 4.7 | 1.6 | 100 | 1,270 | 25 | ○ | ○ | — |
| Example 9 | L5 | 49.3 | 24.8 | 19.6 | 4.7 | 1.6 | 100 | 1,270 | 25 | ○ | ○ | ○ |
| Example 10 | L5 | 49.3 | 24.8 | 19.6 | 4.7 | 1.6 | 100 | 1,300 | 25 | ○ | ○ | ○ |
| Comparative Example 1 | L6 | 49.3 | 24.8 | 19.6 | 4.7 | 1.6 | 100 | 1,100 | 25 | ○ | ○ | ○ |
| Comparative Example 2 | L6 | 49.3 | 24.8 | 19.6 | 4.7 | 1.6 | 100 | 1,250 | 10 | ○ | ○ | ○ |
| Comparative Example 3 | L7 | 49.3 | 18.9 | 25.5 | 4.7 | 1.6 | 100 | 1,250 | 25 | ○ | ○ | — |
| Comparative Example 4 | L1 | 49.3 | 24.8 | 19.6 | 4.7 | 1.6 | 100 | 1,150 | 25 | ○ | ○ | ○ |

| | Coefficient of Thermal Expansion ($\times 10^{-6}/°$ C.) | Bending Strength (MPa) | Index of Orientation Preference (I.O.P) | Index of Orientation Degree | Relative Density (%) |
|---|---|---|---|---|---|
| Example 1 | 4.7 | 216 | 0.15 | 0.83 | 99.9 |
| Example 2 | 3.3 | 216 | 0.04 | 1.38 | 99.6 |
| Example 3 | 3.8 | 252 | 0.10 | 0.99 | 99.9 |
| Example 4 | 4.3 | 249 | 0.13 | 0.87 | 99.6 |
| Example 5 | 4.1 | 234 | 0.13 | 0.88 | 99.6 |
| Example 6 | 4.1 | 249 | 0.12 | 0.93 | 99.9 |
| Example 7 | 4.1 | 246 | 0.13 | 0.90 | 99.9 |
| Example 8 | 3.9 | 239 | 0.12 | 0.91 | 99.2 |
| Example 9 | 4.5 | 275 | 0.13 | 0.87 | 99.8 |
| Example 10 | 4.3 | 265 | 0.12 | 0.93 | 99.9 |
| Comparative Example 1 | 5.1 | 138 | 0.10 | 1.36 | 93.3 |

TABLE 1-continued

| | | | | | |
|---|---|---|---|---|---|
| Comparative Example 2 | 4.4 | 153 | 0.19 | 0.72 | 86.2 |
| Comparative Example 3 | 5.5 | 240 | 0.10 | 1.01 | 99.9 |
| Comparative Example 4 | 4.8 | 149 | 0.07 | 1.14 | 99.6 |

As illustrated in Table 1, the ceramic member in Example 1 (raw material lot: L1) contained enstatite ($MgSiO_3$), boron nitride (BN), and forsterite ($2MgO \cdot SiO_2$) as constituents, the coefficient of thermal expansion in the orientation direction at 150° C. was $4.7 \times 10^{-6}$/° C., and the three-point bending strength was 216 MPa.

In addition, the coefficient of thermal expansion ($\times 10^{-6}$/° C.) in the orientation direction and the coefficient of thermal expansion ($\times 10^{-6}$/° C.) in the pressurization direction were measured in a predetermined temperature range from 20° C. to 250° C. for the two kinds of test pieces 102 and 103 cut from the ceramic member in Example 1. Table 2 is a diagram illustrating the measurement results of each temperature range.

TABLE 2

| | Coefficient of Thermal Expansion ($\times 10^{-6}$/° C.) | |
|---|---|---|
| Temperature (° C.) | Orientation Direction | Pressurization Direction |
| 20 to 100 | 4.6 | 6.2 |
| to 150 | 4.7 | 6.3 |
| to 200 | 4.9 | 6.4 |
| to 250 | 5.0 | 6.6 |

It can be understood from Table 2 that the coefficient of thermal expansion in the orientation direction in the ceramic member was about $(4.6 \text{ to } 5.0) \times 10^{-6}$/° C. in all of the temperature range from 20° C. to 250° C. and achieved a value which is close to the coefficient of thermal expansion ($3.4 \times 10^{-6}$/° C.) of silicon. On the other hand, the coefficient of thermal expansion in the pressurization direction was about $(6.2 \text{ to } 6.6) \times 10^{-6}$/° C. As a result, it became apparent that anisotropy relating to the coefficient of thermal expansion appeared in the ceramic member according to Example 1.

In order to further clearly confirm the aforementioned orientation of the boron nitride grains, measurement of x-ray diffraction was performed using the sintered ceramic member in Example 1, and the index of orientation preference (I.O.P) and the index of the orientation degree of boron nitride were obtained from the measurement result. Values of the index of orientation preference (I.O.P) and the index of the orientation degree of boron nitride are illustrated in Table 1.

As illustrated in Table 1, it can be understood that the c-axis of the boron nitride crystal is oriented parallel to the pressurization in the test material and the surface of the scale-shaped boron nitride crystal is oriented along the plate surface direction of the sintered ceramic member since the index of orientation preference of the sintered ceramic member satisfies I.O.P=0.15<1.

In addition, the relative density (bulk density) of the sintered ceramic member was measured at 99.9%, and the sintered ceramic member was found out to be a precise sintered body.

On the other hand, a ceramic member with a plate thickness of 2.70 mm was formed from the sintered body in Example 1, and 500 through holes were formed in the ceramic member in a matrix shape by drill machining using a carbide drill in order to confirm machinability of the ceramic member. Here, it was possible to set a diameter of each through hole to 160 μm (an aspect ratio is 2.70/0.160=16.9) and set a hole pitch p (see FIG. 5) to 200 μm. As a result, it was possible to achieve ±5 μm as pitch precision. In this sense, it was confirmed that the ceramic member manufactured in Example 1 had satisfactory machinability.

Example 2

A sintered body with a size of 90 mm long×90 mm wide×5 mm thick was sintered using a raw material lot L2 by the method in Example 1 while the sintering temperature was changed to 1300° C. After the sintering, the presence of constituents contained in the sintered ceramic member was analyzed based on x-ray diffraction in the same manner as in Example 1. The result is illustrated in Table 1 along with content of the raw material used in Example 1 and the sintering agent (wt %), a sintering temperature (° C.), a sintering pressure (MPa), and presence of constituents contained in the sintered ceramic member.

Then, a test piece corresponding to the test piece 102 in Example 1 was cut from the sintered ceramic member, and the coefficient of thermal expansion ($\times 10^{-6}$/° C.) based on JIS R 1618 and the three-point bending strength based on JIS R 1601 were measured. In addition, measurement of x-ray diffraction was performed using the sintered ceramic member in Example 2, and the index of orientation preference (I.O.P) and the index of the orientation degree of boron nitride were obtained from the measurement result. Values of the coefficient of thermal expansion, the three-point bending strength, and the index of orientation preference (I.O.P) and the index of the orientation degree of boron nitride are illustrated together in Table 1. In addition, a value of relative density (bulk density) measured for the sintered ceramic member is illustrated in Table 1. Furthermore, a relationship between the measured coefficient of thermal expansion and the sintering temperature and a relationship between the measured three-point bending strength and the sintering temperature are illustrated as a point Ex2 respectively in FIGS. 9 and 10.

As illustrated in Table 1, the ceramic member in Example 2 contained at least boron nitride and enstatite as constituents, the coefficient of thermal expansion in the orientation direction at 150° C. was $3.3 \times 10^{-6}$/° C., and the three-point bending strength was 216 MPa. In addition, the index of orientation preference satisfied I.O.P=0.04, the index of the orientation degree was 1.38, the relative density was 99.6%, and it was found out that the boron nitride crystals were oriented along the plate surface of the ceramic member and that the ceramic member was a precise sintered body.

Through holes were worked in the ceramic member in the same manner as in Example 1 in order to confirm machinability of the sintered ceramic member. As a result, it was confirmed that the ceramic member manufactured in Example 2 had substantially the same machinability as that of the ceramic member manufactured in Example 1.

Example 3

The same analysis as that in Example 2 was performed on a sintered ceramic member and a cut test piece in the same manner as in Example 2 other than that a raw material lot L3 was used and the sintering temperature was changed to 1250° C., and the measurement result is illustrated in Table 1 along with the content of the raw materials and the like. In addition, a relationship between the measured coefficient of thermal expansion and the sintering temperature and a relationship between the measured three-point bending strength and the sintering temperature are illustrated as a point Ex3 respectively in FIGS. 9 and 10.

As illustrated in Table 1, the ceramic member in Example 3 contained boron nitride and enstatite as constituents, the coefficient of thermal expansion in the direction which is parallel to the orientation direction was $3.8 \times 10^{-6}/°C.$, and the three-point bending strength was 252 MPa. In addition, the index of orientation preference satisfied I.O.P=0.10, the index of the orientation degree was 0.99, the relative density was 99.9%, and it was found out that the boron nitride crystals were oriented along the plate surface of the ceramic member and that the ceramic member was a precise sintered body.

Through holes were formed in the same manner as in Example 2 in order to confirm machinability of the ceramic member. As a result, it was confirmed that the ceramic member manufactured in Example 3 had substantially the same machinability as that of the ceramic member manufactured in Example 1.

Example 4

The same analysis as that in Example 2 was performed on a sintered ceramic member and a cut test piece in the same manner as in Example 2 other than that the raw material lot L3 was used and the sintering temperature was changed to 1250° C., and the measurement result is illustrated in Table 1 along with the content of the raw materials and the like. In addition, a relationship between the measured coefficient of thermal expansion and the sintering temperature and a relationship between the measured three-point bending strength and the sintering temperature are illustrated as a point Ex4 respectively in FIGS. 9 and 10.

As illustrated in Table 1, the ceramic member in Example 4 contained at least boron nitride and enstatite as constituents, the coefficient of thermal expansion in the direction which is parallel to the orientation direction was $4.3 \times 10^{-6}/°C.$, and the three-point bending strength was 249 MPa. In addition, the index of orientation preference satisfied I.O.P=0.13, the index of the orientation degree was 0.87, the relative density was 99.6%, and it was found out that the boron nitride crystals were oriented along the plate surface of the ceramic member and that the ceramic member was a precise sintered body.

Through holes were formed in the same manner as in Example 2 in order to confirm machinability of the ceramic member. As a result, it was confirmed that the ceramic member manufactured in Example 4 had substantially the same machinability as that of the ceramic member manufactured in Example 1.

Example 5

The same analysis as that in Example 2 was performed on a sintered ceramic member and a cut test piece in the same manner as in Example 2 other than that a raw material lot L4 was used and the sintering temperature was changed to 1250° C., and the measurement result is illustrated in Table 1 along with the content of the raw materials and the like. In addition, a relationship between the measured coefficient of thermal expansion and the sintering temperature and a relationship between the measured three-point bending strength and the sintering temperature are illustrated as a point Ex5 respectively in FIGS. 9 and 10.

As illustrated in Table 1, the ceramic member in Example 5 contained boron nitride and enstatite as constituents, the coefficient of thermal expansion in the direction which is parallel to the orientation direction was $4.1 \times 10^{-6}/°C.$, and the three-point bending strength was 234 MPa. In addition, the index of orientation preference satisfied I.O.P=0.13, the index of the orientation degree was 0.88, the relative density was 99.6%, and it was found out that the boron nitride crystals were oriented along the plate surface of the ceramic member and that the ceramic member was a precise sintered body.

Through holes were formed in the same manner as in Example 2 in order to confirm machinability of the ceramic member. As a result, it was confirmed that the ceramic member manufactured in Example 5 had substantially the same machinability as that of the ceramic member manufactured in Example 1.

Example 6

The same analysis as that in Example 2 was performed on a sintered ceramic member and a cut test piece in the same manner as in Example 2 other than that the raw material lot L3 was used and the sintering temperature was changed to 1230° C., and the measurement result is illustrated in Table 1 along with the content of the raw materials and the like. In addition, a relationship between the measured coefficient of thermal expansion and the sintering temperature and a relationship between the measured three-point bending strength and the sintering temperature are illustrated as a point Ex6 respectively in FIGS. 9 and 10.

As illustrated in Table 1, the ceramic member in Example 6 contained boron nitride and enstatite as constituents, the coefficient of thermal expansion in the direction which is parallel to the orientation direction was $4.1 \times 10^{-6}/°C.$, and the three-point bending strength was 249 MPa. In addition, the index of orientation preference satisfied I.O.P=0.12, the index of the orientation degree was 0.93, the relative density was 99.9%, and it was found out that the boron nitride crystals were oriented along the plate surface of the ceramic member and that the ceramic member was a precise sintered body.

Through holes were formed in the same manner as in Example 2 in order to confirm machinability of the ceramic member. As a result, it was confirmed that the ceramic member manufactured in Example 6 had substantially the same machinability as that of the ceramic member manufactured in Example 1.

Example 7

The same analysis as that in Example 2 was performed on a sintered ceramic member and a cut test piece in the same manner as in Example 2 other than that the raw material lot L4 was used and the sintering temperature was changed to 1230° C., and the measurement result is illustrated in Table 1 along with the content of the raw materials and the like. In addition, a relationship between the measured coefficient of thermal expansion and the sintering temperature and a relationship between the measured three-point bending strength and the sintering temperature are illustrated as a point Ex7 respectively in FIGS. 9 and 10.

As illustrated in Table 1, the ceramic member in Example 7 contained boron nitride and enstatite as constituents, the coefficient of thermal expansion in the direction which is parallel to the orientation direction was $4.1 \times 10^{-6}$/° C., and the three-point bending strength was 246 MPa. In addition, the index of orientation preference satisfied I.O.P=0.13, the index of the orientation degree was 0.90, the relative density was 99.9%, and it was found out that the boron nitride crystals were oriented along the plate surface of the ceramic member and that the ceramic member was a precise sintered body.

Through holes were formed in the same manner as in Example 2 in order to confirm machinability of the ceramic member. As a result, it was confirmed that the ceramic member manufactured in Example 7 had substantially the same machinability as that of the ceramic member manufactured in Example 1.

Example 8

The same analysis as that in Example 2 was performed on a sintered ceramic member and a cut test piece in the same manner as in Example 2 other than that a raw material lot L4 was used and the sintering temperature was changed to 1270° C., and the measurement result is illustrated in Table 1 along with the content of the raw materials and the like. In addition, a relationship between the measured coefficient of thermal expansion and the sintering temperature and a relationship between the measured three-point bending strength and the sintering temperature are illustrated as a point Ex8 respectively in FIGS. 9 and 10.

As illustrated in Table 1, the ceramic member in Example 8 contained boron nitride and enstatite as constituents, the coefficient of thermal expansion in the direction which is parallel to the orientation direction was $3.9 \times 10^{-6}$/° C., and the three-point bending strength was 239 MPa. In addition, the index of orientation preference satisfied I.O.P=0.12, the index of the orientation degree was 0.91, the relative density was 99.2%, and it was found out that the boron nitride crystals were oriented along the plate surface of the ceramic member and that the ceramic member was a precise sintered body.

Through holes were formed in the same manner as in Example 2 in order to confirm machinability of the ceramic member. As a result, it was confirmed that the ceramic member manufactured in Example 8 had substantially the same machinability as that of the ceramic member manufactured in Example 1.

Example 9

The same analysis as that in Example 2 was performed on a sintered ceramic member and a cut test piece in the same manner as in Example 2 other than that a raw material lot L5 was used and the sintering temperature was changed to 1270° C., and the measurement result is illustrated in Table 1 along with the content of the raw materials and the like. In addition, a relationship between the measured coefficient of thermal expansion and the sintering temperature and a relationship between the measured three-point bending strength and the sintering temperature are illustrated as a point Ex9 respectively in FIGS. 9 and 10.

As illustrated in Table 1, the ceramic member in Example 9 contained at least boron nitride and enstatite as constituents, the coefficient of thermal expansion in the direction which is parallel to the orientation direction was $4.5 \times 10^{-6}$/° C., and the three-point bending strength was 275 MPa. In addition, the index of orientation preference satisfied I.O.P=0.13, the index of the orientation degree was 0.87, the relative density was 99.8%, and it was found out that the boron nitride crystals were oriented along the plate surface of the ceramic member and that the ceramic member was a precise sintered body.

Through holes were formed in the same manner as in Example 2 in order to confirm machinability of the ceramic member. As a result, it was confirmed that the ceramic member manufactured in Example 9 had substantially the same machinability as that of the ceramic member manufactured in Example 1.

Example 10

The same analysis as that in Example 2 was performed on a sintered ceramic member and a cut test piece in the same manner as in Example 2 other than that the raw material lot L5 was used and the sintering temperature was changed to 1300° C., and the measurement result is illustrated in Table 1 along with the content of the raw materials and the like. In addition, a relationship between the measured coefficient of thermal expansion and the sintering temperature and a relationship between the measured three-point bending strength and the sintering temperature are illustrated as a point Ex10 respectively in FIGS. 9 and 10.

As illustrated in Table 1, the ceramic member in Example 10 contained at least boron nitride and enstatite as constituents, the coefficient of thermal expansion in the direction which is parallel to the orientation direction was $4.3 \times 10^{-6}$/° C., and the three-point bending strength was 265 MPa. In addition, the index of orientation preference satisfied I.O.P=0.12, the index of the orientation degree was 0.93, the relative density was 99.9%, and it was found out that the boron nitride crystals were oriented along the plate surface of the ceramic member and that the ceramic member was a precise sintered body.

Through holes were formed in the same manner as in Example 2 in order to confirm machinability of the ceramic member. As a result, it was confirmed that the ceramic member manufactured in Example 10 had substantially the same machinability as that of the ceramic member manufactured in Example 1.

Comparative Examples 1 to 4

Next, for the purpose of comparison, ceramic members in Comparative Examples 1 to 4 were sintered while rates of the raw materials and the sintering agent (wt %), the sintering temperature (° C.), and the sintering pressure (MPa) were changed, and presence of contained constituents, a coefficient of thermal expansion ($\times 10^{-6}$/° C.), three-point bending strength, an index of orientation preference, an index of an orientation degree, and relative density (bulk density) were measured for each of the sintered ceramic members and the cut test pieces in the same manner as in Examples 1 to 10. The measurement result is illustrated in Table 1 along with the content of raw materials used in Comparative Examples 1 to 4 (wt %), the content of sintering agent (wt %), the sintering temperature (° C.), and the sintering pressure (MPa). In addition, a relationship between the measured coefficient of thermal expansion and the sintering temperature and a relationship between the measured three-point bending strength and the sintering temperature are illustrated as each of points Ce1 to Ce4 respectively in FIGS. 9 and 10.

As illustrated in Table 1, the ceramic members in Comparative Examples 1 to 4 contained at least boron nitride and enstatite. Among the ceramic members in Comparative Examples 1 to 4, however, a coefficient of thermal expansion was outside a range of $(3 \text{ to } 5) \times 10^{-6}/°$ C. while three-point bending strength was outside a range from 200 MPa to 300 MPa (Comparative Example 1), a coefficient of thermal expansion was outside the range of $(3 \text{ to } 5) \times 10^{-6}/°$ C. (Comparative Example 3), or three-point bending strength was outside the range from 200 MPa to 300 MPa (Comparative Examples 2 and 4).

INDUSTRIAL APPLICABILITY

As described above, the ceramic member according to the present invention is preferable as a material of a probe holder into which probes for electrically connecting a circuit structure of a test object and a circuit structure for sending a signal for the test are inserted in a micro contactor used in a semiconductor test and a liquid crystal test, and the manufacturing method according to the present invention is preferable for manufacturing the ceramic member for the probe holder.

REFERENCE SIGNS LIST 1 probe holder
1A, 1B surface
2 probe card
3 probe
4 space transformer
5 interposer
6 wiring substrate
7 male connector
8 reinforcing member
9 silicon wafer
11 through hole
11a large diameter portion
11b small diameter portion
31, 32 needle-shaped member
33 spring member
41, 91 electrode pad
101 sintered body
102, 103 test piece
S minute region
W wiring

The invention claimed is:

1. A ceramic member comprising enstatite and boron nitride as constituents,
wherein the ceramic member is a sintered body in which the boron nitride is oriented in a single direction.

2. The ceramic member according to claim 1,
wherein an index of an orientation degree $K = |\log_{10}\{(I_{(100)}/I_{(002)})\|/(I_{(100)}/I_{(002)})\perp\}|$, which is given based on a ratio $(I_{(100)}/I_{(002)})\|$ between strength $I_{(002)}$ of x-ray diffraction along a (002) plane of a crystal of the boron nitride and strength $I_{(100)}$ of x-ray diffraction along a (100) plane when x-ray irradiation is performed in a direction which is perpendicular to an orientation direction of the boron nitride and a ratio $(I_{(100)}/I_{(002)})\perp$ between strength $I_{(002)}$ of x-ray diffraction along the (002) plane and strength $I_{(100)}$ of x-ray diffraction along the (100) plane when x-ray irradiation is performed in the orientation direction, is not less than 0.8.

3. The ceramic member according to claim 1,
wherein a coefficient of thermal expansion which is measured based on JIS R 1618 at 20° C. to 250° C. in a direction in parallel to a direction in which the boron nitride is oriented is $(3 \text{ to } 5) \times 10^{-6}/°$ C.

4. The ceramic member according to claim 1,
wherein three-point bending strength measured based on JIS R 1601 is not less than 200 MPa.

5. The ceramic member according to claim 1,
wherein relative density is not less than 99%.

6. The ceramic member according to claim 1,
wherein boron nitrogen has a hexagonal crystal structure and is in a form of scale-shaped grains.

7. A probe holder, comprising:
a base material formed using a ceramic member comprising enstatite and boron nitride as constituents, the ceramic member being a sintered body in which the boron nitride is oriented in a single direction; and
through holes capable of allowing probes formed of a conductive material to be inserted and accommodates the probes,
wherein the through holes are formed in the base material in a direction which is perpendicular to the orientation direction of the boron nitride.

8. A manufacturing method of a ceramic member comprising:
a mixing step of mixing boron nitride, silicon oxide, magnesium oxide, and sintering agent;
an external force acting step of making external force directed in a single direction act on a mixture mixed in the mixing process; and
a sintering step of sintering the mixture.

9. The manufacturing method of a ceramic member according to claim 8,
wherein the sintering agent contains yttrium oxide and aluminum oxide.

10. The manufacturing method of a ceramic member according to claim 8,
wherein the external force acting step and the sintering step are collectively performed by a hot pressing sintering method.

11. The manufacturing method of a ceramic member according to claim 8,
wherein a sintering temperature in the sintering step is from 1200° C. to 1300° C.

12. The manufacturing method of a ceramic member according to claim 8,
wherein the sintering step is performed in a depressurized atmosphere or an inert atmosphere.

13. The manufacturing method of a ceramic member according to claim 8,
wherein the boron nitride has a hexagonal crystal structure and is in a form of scale-shaped grains.

* * * * *